(12) United States Patent
Kobayashi et al.

(10) Patent No.: US 8,964,074 B2
(45) Date of Patent: Feb. 24, 2015

(54) AMPLIFICATION CIRCUIT, PHOTOELECTRIC CONVERSION APPARATUS, AND IMAGING SYSTEM

(71) Applicant: Canon Kabushiki Kaisha, Tokyo (JP)

(72) Inventors: Hideo Kobayashi, Tokyo (JP); Masanori Ogura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 145 days.

(21) Appl. No.: 13/849,024

(22) Filed: Mar. 22, 2013

(65) Prior Publication Data

US 2013/0258148 A1 Oct. 3, 2013

(30) Foreign Application Priority Data

Mar. 29, 2012 (JP) ................. 2012-076771

(51) Int. Cl.
| | |
|---|---|
| *H04N 3/14* | (2006.01) |
| *H04N 5/235* | (2006.01) |
| *H03M 1/66* | (2006.01) |
| *H01L 27/00* | (2006.01) |
| *H03F 3/45* | (2006.01) |
| *H03F 3/08* | (2006.01) |

(52) U.S. Cl.
CPC ............ *H03F 3/45076* (2013.01); *H03F 3/082* (2013.01); *H03F 3/45475* (2013.01); *H03F 2203/45138* (2013.01); *H03F 2203/45514* (2013.01); *H03F 2203/45551* (2013.01)
USPC ........ 348/294; 348/229.1; 348/241; 348/300; 250/208.1; 341/150; 341/172; 330/260

(58) Field of Classification Search
CPC ......... H04N 3/14; H04N 5/235; H04N 5/217; H04N 9/64; H03F 3/45; H01L 27/00; H03M 1/66
USPC .............. 348/294, 229.1, 297, 241, 243, 300, 348/301; 341/150, 172; 250/208.1; 330/260
See application file for complete search history.

(56) References Cited

U.S. PATENT DOCUMENTS

| | | | | |
|---|---|---|---|---|
| 5,841,310 | A * | 11/1998 | Kalthoff et al. | 327/337 |
| 7,692,702 | B2 * | 4/2010 | Sano | 348/300 |
| 8,159,582 | B2 * | 4/2012 | Kato et al. | 348/301 |
| 8,680,925 | B2 * | 3/2014 | Christen | 330/297 |
| 2002/0134918 | A1 * | 9/2002 | Miida | 250/214.1 |
| 2005/0259167 | A1 * | 11/2005 | Inoue et al. | 348/300 |

FOREIGN PATENT DOCUMENTS

JP 2-210859 A 8/1990

\* cited by examiner

*Primary Examiner* — Tuan Ho
*Assistant Examiner* — Marly Camargo
(74) *Attorney, Agent, or Firm* — Canon USA Inc IP Division

(57) ABSTRACT

An amplification circuit includes an amplifier, a first capacitor including a first terminal connected to an input terminal of the amplifier, a second capacitor including a first terminal connected to the input terminal of the amplifier and a second terminal connected to an output terminal of the amplifier, and a correction unit configured to correct a difference in bias dependency between capacitance values of the first and second capacitors.

12 Claims, 10 Drawing Sheets

AMPLIFICATION CIRCUIT, PHOTOELECTRIC CONVERSION APPARATUS, AND IMAGING SYSTEM

TECHNICAL FIELD

Aspect of the present invention generally relate to an amplification circuit, a photoelectric conversion apparatus, and an imaging system.

BACKGROUND

There is known an amplifier of a capacitance feedback type, in which input/output terminals are connected via a capacitor. FIG. 10 of JP-A 2-210859 discloses an amplification circuit in which two capacitors, having substantially the same upper electrodes and lower electrodes, are provided in a feedback path with the upper electrode of one of the capacitors connected to the lower electrode of the other capacitor. With this configuration, it is possible to improve linearity of the output of the amplification circuit.

Assume that the amplification circuit disclosed in JP-A 2-210859 receives signals from an input capacitance. In this case, the gain of the amplification circuit is calculated by a ratio between a capacitance value of the input capacitance and a capacitance value of a feedback capacitance.

The capacitance value of the input capacitance, however, changes according to the magnitude of applied bias (bias dependency of capacitance value). Therefore, the gain of the amplification circuit changes according to the amplitude of signals retained by the input capacitance, thereby decreasing the linearity of the output of the amplification circuit.

The present invention has been made to solve the above problems.

SUMMARY

According to an aspect of the present invention to solve the above problems, there is provided an amplification circuit including an amplifier, a first capacitor including a first terminal connected to an input terminal of the amplifier, a second capacitor including a first terminal connected to the input terminal of the amplifier and a second terminal connected to an output terminal of the amplifier, and a correction unit configured to correct a difference in bias dependency between capacitance values of the first and second capacitors.

According to the present invention, it is possible to improve the linearity of the output of the amplification circuit.

DESCRIPTION OF EMBODIMENTS

First Embodiment

An embodiment of the present invention will be described.

Figure 1:
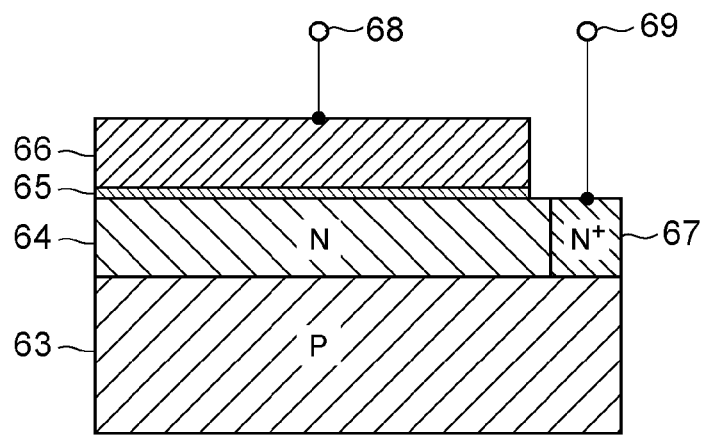
FIG. 1 is a cross-sectional view of a capacitor according to a first embodiment.

FIG. 1 is a view showing an exemplary cross-sectional configuration of a capacitor C formed on a semiconductor substrate.

An N-type semiconductor region 64 (N-type is referred as to a second conductivity type in this embodiment) is formed on a P-type semiconductor region 63 (P-type is referred as to a first conductivity type). An N-type semiconductor region 67 having a higher impurity concentration than the semiconductor region 64 is further formed on the semiconductor region 63. An insulating film and a polysilicon layer 66 are stacked on the semiconductor region 64. The semiconductor region 64 functions as a lower electrode of the capacitor C and is connected to a terminal 69 via the semiconductor region 67 serving as a contact. Meanwhile, the polysilicon layer 66 containing polysilicon functions as an upper electrode of the capacitor C and is connected to a terminal 68.

Figure 2:
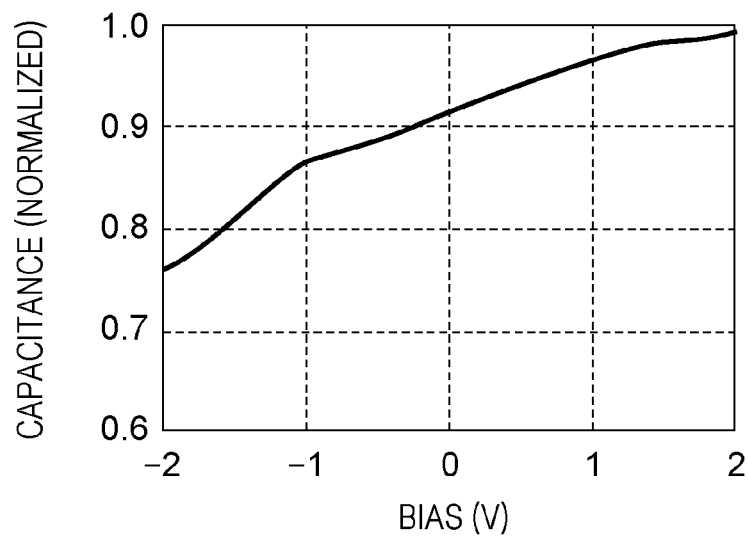
FIG. 2 is a graph showing a bias-dependent characteristic of a capacitance value of the capacitor according to the first embodiment.

FIG. 2 is a graph showing a bias-dependent characteristic of a capacitance value of the capacitor C. The horizontal axis of the graph shows a voltage (bias) between the upper electrode and the lower electrode. A positive value indicates that the potential of the upper electrode is higher. The vertical axis of the graph shows a capacitance value, which is normalized to reach 1.0 when the bias is 2.0 V. As shown in FIG. 2, the lower the bias, i.e., the lower the potential of the upper electrode relative to the potential of the lower electrode, the lower the capacitance value. As the potential of the upper electrode is relatively lowered, a depletion layer formed in the semiconductor region 64 (lower electrode) extends in the depth direction as viewed from the upper electrode, whereby the effective thickness of the insulating film 65 increases.

Figure 3:
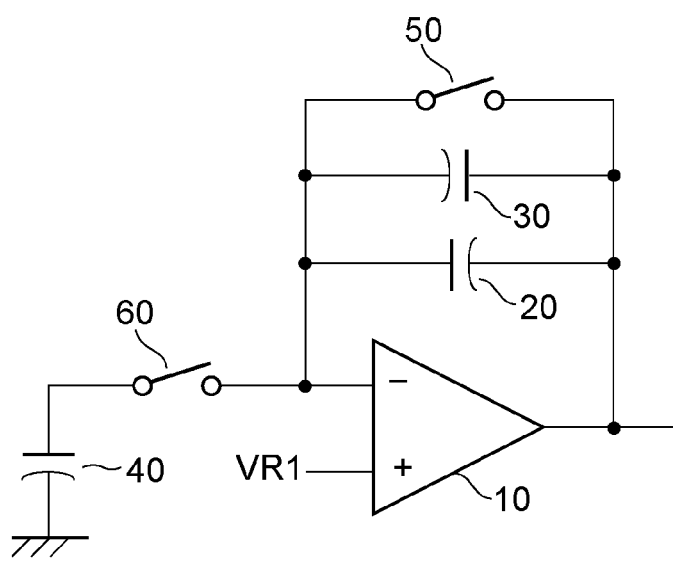
FIG. 3 is an equivalent circuit diagram of an amplification circuit according to the first embodiment.

FIG. 3 is an equivalent circuit diagram of an amplification circuit 1 according to the present embodiment. The amplification circuit 1 includes an operation amplifier 10, capacitors 20, 30, and 40, and switches 50 and 60. A terminal shown with a straight line in each of the capacitors 20, 30, and 40 corresponds to the upper electrode of the capacitor C shown in FIG. 1, and a terminal shown with a curved line corresponds to the lower electrode thereof. That is, an upper electrode of the capacitor 20 and a lower electrode of the capacitor 30 are connected to an inversion input terminal of the operation amplifier 10, and a lower electrode of the capacitor 20 and an upper electrode of the capacitor 30 are connected to an output terminal of the operation amplifier 10. An upper electrode of the capacitor 40 is connected to the inversion input terminal of the operation amplifier 10 via the switch 60, and a lower electrode thereof is set at a ground potential. The switch 50 is provided between the inversion input terminal and the output terminal of the operation amplifier 10. A reference potential VR1 is applied to a non-inversion input terminal of the operation amplifier 10.

It is assumed that, in the configuration shown in FIG. 3, a signal retained in the capacitor 40 is amplified. It is also assumed that an initial potential of VR1+Vs has been applied to the capacitor 40. Vs is a signal amplitude.

First, the switch 50 is turned on with the switch 60 turned off. As a result, the potentials at both ends of each of the capacitors 20 and 30 become almost equal to VR1.

Next, the switch 60 is turned on after the switch is turned off. With the operation amplifier 10 substantially grounded, the potential of the upper electrode of the capacitor 40 becomes equal to VR1. Therefore, assuming that a capacitance value of the capacitor 40 is C40, an electric charge equivalent to Vs×C40 is transferred to the capacitors 20 and 30 by turning on the switch 60. As a result, the potential Vout of the output terminal of the amplification circuit 1 is expressed by the following expression.

$$V\text{out}=VR1-\{C40/(C20+C30)\}Vs \quad (1)$$

Here, C20 and C30 are capacitance values of the capacitors 20 and 30, respectively.

Therefore, assuming that a change in potential of the capacitor 40 from its initial value is $\Delta$Vs, and a change in potential of the output of the amplification circuit 1 is $\Delta$Vout, the gain G is obtained by:

$$G=\Delta V\text{out}/\Delta Vs=-C40/(C20+C30) \quad (2)$$

In a case where C40=(C20+C30), the gain G of the amplification circuit 1 is −1, and thus Vout=VR1−Vs is satisfied according to Expression (1). Therefore, when the signal amplitude Vs changes from 0 V to 0.8 V with VR1 set to 1 V, Vout changes from 1 V to 0.2 V, and a voltage of 0.8 V, at a maximum, is applied to both ends of each of the capacitors 20 and 30. The potential of the capacitor 40, on the other hand, changes within the range of 1 V to 1.8 V. As described above, the capacitance values of the capacitors 20, 30, and 40 have a bias dependency. Therefore, the gain changes from −1 according to the magnitude of the signal amplitude Vs.

Figure 4A:
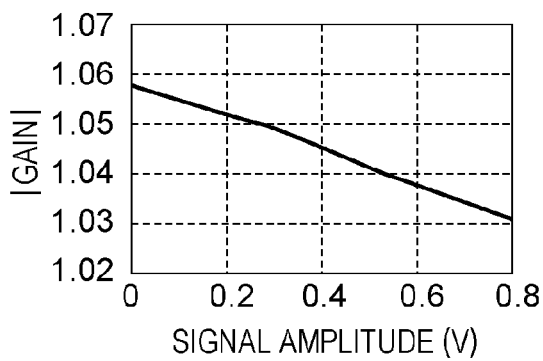
FIGS. 4A to 4E are graphs showing signal amplitude-dependent characteristics of the gain of the amplification circuit according to the first embodiment.

FIG. 4A is a graph showing a change in gain in the case where a ratio between the capacitance values of the capacitors 20 and 30 under the same condition satisfies C20:C30=10:0, that is, the case where the capacitor 30 is not provided. The horizontal axis of the graph shows the signal amplitude Vs, and the vertical axis thereof shows an absolute value of the gain of the amplification circuit 1.

As the signal amplitude Vs increases, the absolute value of the gain decreases. This is because the voltage applied to the capacitor 40 changes within the range of 1 V to 1.8 V, while the voltage applied to the capacitor 20 changes within the range of 0 V to 0.8 V. The characteristics of the capacitors are shown in FIG. 2. The capacitance values of the capacitors change differently in the bias range, and thus the absolute value of the gain G is not constant. In this example, an increment of the capacitance value of the capacitor 20 is larger than an increment of the capacitance value of the capacitor 40. Therefore, as the signal amplitude increases, the absolute value of the gain decreases.

Figure 4B:
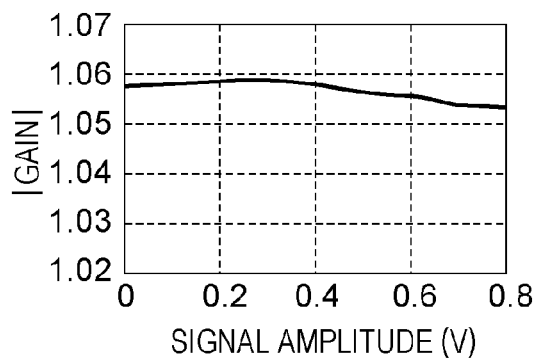

FIG. 4B is a graph showing a change in gain in the case where a ratio between the capacitance values of the capacitors 20 and 30 under the same condition satisfies C20:C30=7.5:2.5. In this example, the gain changes slightly in the signal amplitude range of 0 V to 0.8 V, indicating that the linearity of the output of the amplification circuit has been improved. Particularly when the signal amplitude is small at 0 V to 0.4 V, an almost constant gain can be obtained.

In this manner, the linearity of the output of the amplification circuit is improved due to the capacitor 30. The bias of the capacitor 30 changes in the range of 0 V to −0.8 V in FIG. 2. Therefore, as the signal amplitude Vs increases, the capacitance value of the capacitor 30 decreases. This offsets an increment of the capacitance value of the capacitor 20. As a result, the signal amplitude dependency of the gain decreases, improving the linearity of the output of the amplification circuit.

Figure 4C:
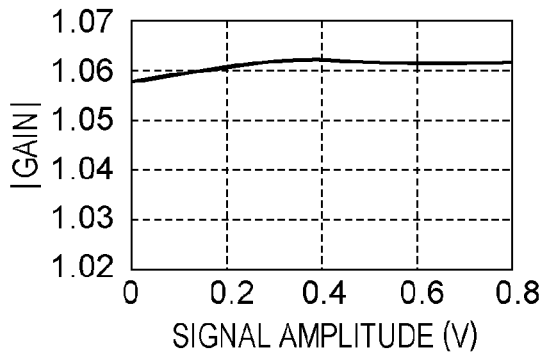

FIG. 4C is a graph showing a change in gain in the case where a ratio between the capacitance values of the capacitors 20 and 30 under the same condition satisfies C20:C30=6.5:3.5. In this case, the gain is generally constant in the signal amplitude range of 0 V to 0.8 V. As compared to the gain characteristic shown in FIG. 4B, in FIG. 4C, the signal amplitude dependency of the gain is high in the range where the signal amplitude is small, while the signal amplitude dependency of the gain is low in the signal amplitude range of 0.3 V to 0.8 V.

The linearity of the output in a small-signal region is required in an application with a small signal amplitude, such as in a photoelectric conversion apparatus. In this case, therefore, it is preferable to set the gain of the amplification circuit to obtain the characteristic shown in FIG. 4B. In an application with a large signal amplitude provided to an amplifier, it is possible to set the gain of the amplification circuit to obtain the characteristic shown in FIG. 4C. That is, the ratio between the capacitance values of the capacitors 20 and 30 is preferably set depending on a signal region where the linearity of the output is considered important.

In the case where the ratio between the capacitance values of the capacitors 20 and 30 is set to an inappropriate value, on the other hand, the amplification circuit would have a gain characteristic with an increased signal amplitude dependency. For example, FIG. 4D is a graph showing a gain characteristic in the case of C20:C30=3:7.

Figure 4D:
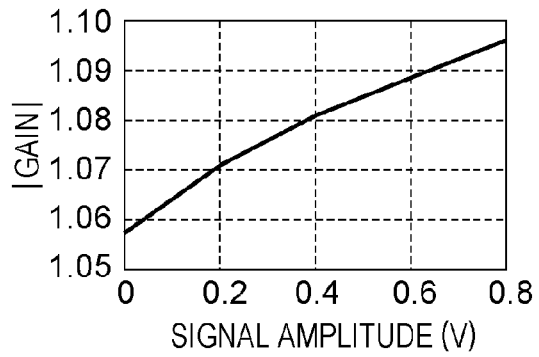

In FIG. 4D, as the signal amplitude increases, the absolute value of the gain increases. Such a gain characteristic is not preferable because the linearity of the output of the amplification circuit is lowered.

Figure 4E:
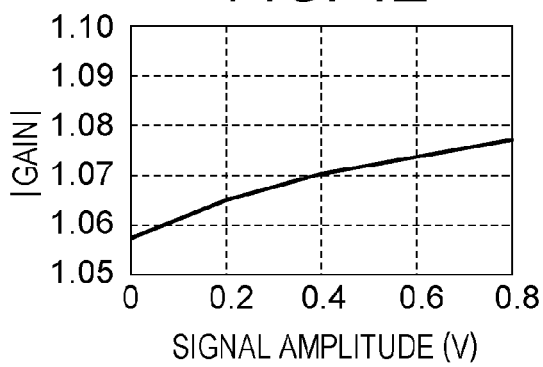

FIG. 4E is a graph showing a signal amplitude-dependent characteristic of the gain of the amplification circuit 1 in the case of C20:C30=5:5. As can be seen from the graph, as the signal amplitude increases, the gain of the amplification circuit also increases.

To summarize the above, the capacitor 30 serving as the third capacitor functions as a correction unit configured to correct a difference in bias dependency between the capacitance value of the capacitor 10 serving as the first capacitor and the capacitance value of the capacitor 20 serving as the second capacitor.

In the configuration shown in FIG. 1, the linearity of the output of the amplification circuit is improved in such a manner that the capacitor 30 is provided in parallel to the capacitor 20, which is a feedback capacitance of the operation amplifier 10, with the upper electrodes respectively connected to the lower electrodes. It is possible to improve the linearity of the output also by providing the input capacitances with a similar configuration. That is, the input capacitances are provided in parallel by connecting an upper electrode of one capacitor to a lower electrode of the other capacitor.

Figure 5:
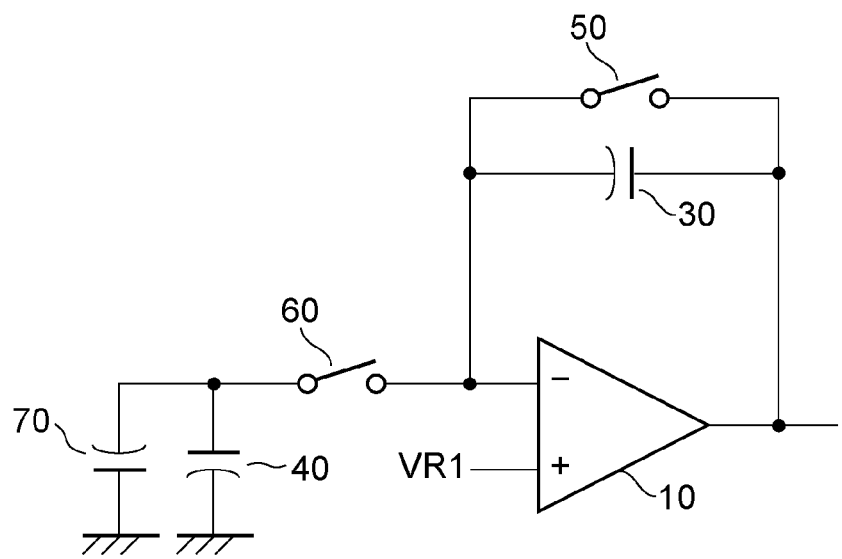
FIG. 5 is an equivalent circuit diagram of another amplification circuit according to the first embodiment.

FIG. 5 is a diagram showing another configuration of the first embodiment. It is assumed here that VR1=1 V is satisfied, and that the signal amplitude Vs of capacitors 40 and 70 changes in the range of 1 V to 1.8 V. In this case, the output Vout of the operation amplifier 10 changes in the range of 1 V to 0.2 V. Similarly, the voltages at both ends of the capacitors 30, 40, and 70 change in the ranges of 0 V to −0.8 V, 1 V to 1.8 V, and −1 V to −1.8 V, respectively. With reference to the bias-dependent characteristic of the capacitance value shown in FIG. 2, the capacitance value of the capacitor 70 decreases more significantly than the capacitance value of the capacitor 30 in the above ranges. In contrast, the capacitance value of the capacitor 40 increases. Therefore, the capacitor 40 can be set such that the gain thereof becomes constant in a region where the linearity is required, as shown in FIGS. 4B and 4C.

In the configuration shown in FIG. 5, the capacitor 40 serves as the first capacitor, the capacitor serves as the second capacitor, and the capacitor 70 serving as the fourth capacitor functions as a correction unit configured to correct the gain characteristic of the amplification circuit.

Second Embodiment

Another embodiment of the present invention will be described.

Figure 6:
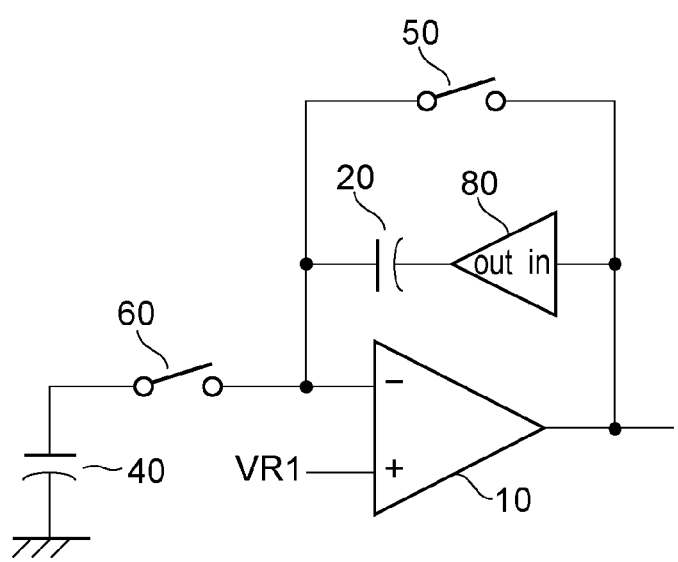
FIG. 6 is an equivalent circuit diagram of an amplification circuit according to a second embodiment.

FIG. 6 is an equivalent circuit diagram showing the configuration of an amplification circuit according to the present embodiment. In the description below, the same elements as those shown in FIG. 3 are denoted with the same reference signs, and a difference from the first embodiment will mainly be described.

In the amplification circuit shown in FIG. 3, the capacitors 20 and 30 are provided in parallel in the feedback path of the operation amplifier 10. In the present embodiment, on the other hand, a level shift circuit 80 is provided in series, instead of the capacitor 30, between a capacitor 20 and an output terminal of an operation amplifier 10. The level shift circuit 80 receives the output of the operation amplifier 10 as an input signal.

The amplification circuit shown in FIG. 6 performs a similar operation to the first embodiment in the case of amplifying a signal VR1+Vs retained in a capacitor 40. It is assumed that, as in the first embodiment, VR1 is 1 V and the signal amplitude Vs changes in the range of 0 V to 0.8 V. It is also assumed that the capacitors 20 and 40 have the same capacitance value under the same bias condition.

Without the level shift circuit 80, the amplification circuit would exhibit a similar characteristic to that shown in FIG. 4A. That is, in the case where the signal amplitude Vs changes in the range of 1 V to 1.8 V, the potential of the capacitor 20 changes in the range of 0 V to 0.8 V. In contrast, in the present embodiment, the level shift circuit 80 is provided. As a result, as the signal amplitude Vs increases, the potential of the lower electrode of the capacitor 20 decreases. Therefore, the voltage applied to the capacitor 20 becomes closer to the voltage applied to the capacitor 40, obtaining a substantially constant signal amplitude dependency of the gain.

Examples of the specific configuration of the level shift circuit 80 include a source follower circuit and a voltage follower circuit.

In the present embodiment, it is possible not only to improve the linearity of the output of the amplification circuit as in the first embodiment, but also to reduce an influence of substrate noise generated from a substrate on which the amplification circuit is formed. The reason for this will be described below.

In the case where the capacitors 20 and 40 have the configuration shown in FIG. 1, a depletion layer is formed between an N-type semiconductor region 64 serving as the lower electrode and a P-type semiconductor region 63. There-fore, a depletion layer capacitance exists. When the potential of the P-type semiconductor region 63 changes due to noise, the potential of the N-type semiconductor region 64 also changes via the depletion layer capacitance. Therefore, in the case where the lower electrode of the capacitor is connected to the input terminal of the operation amplifier 10, noise generated in the P-type semiconductor region is input to and amplified by the operation amplifier 10. In the amplification circuit of the present embodiment, the upper electrodes of the capacitors 20 and 40 are connected to an inversion input terminal of the operation amplifier 10, making it possible to reduce the influence of the substrate noise.

In the present embodiment, the level shift circuit 80 functions as a correction unit configured to correct the gain characteristic of the amplification circuit. In other words, the level shift circuit 80 functions as a potential adjusting unit configured to adjust the potential of the lower electrode of the capacitor 20, thereby correcting a difference in bias-dependent characteristic between the capacitance values of the capacitors 20 and 40.

Third Embodiment

Another embodiment of the present invention will be described.

Figure 7:
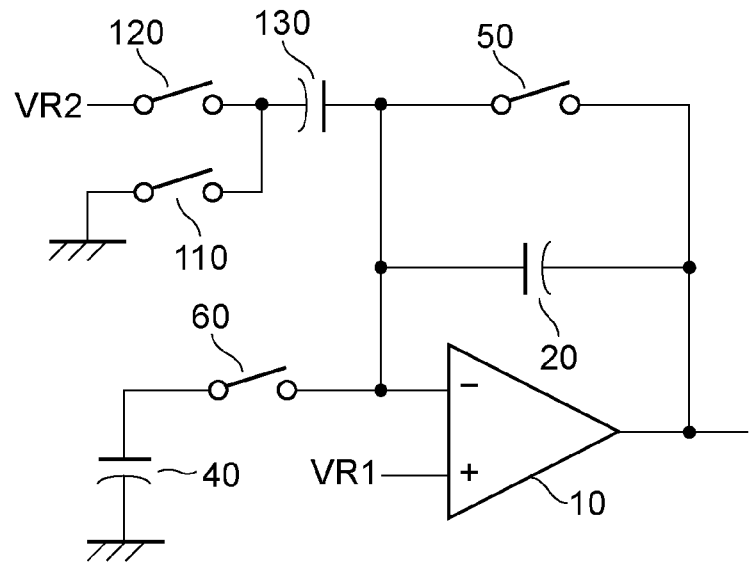
FIG. 7 is an equivalent circuit diagram of an amplification circuit according to a third embodiment.

FIG. 7 is an equivalent circuit diagram showing the configuration of an amplification circuit according to the present embodiment. In the description below, the same elements as those shown in FIG. 3 are denoted with the same reference signs, and a difference from the amplification circuit of the second embodiment will mainly be described.

In the second embodiment, the level shift circuit 80 is provided in the feedback path of the operation amplifier 10 to adjust the potential of the lower electrode of the capacitor 20. In this case, it may be difficult to widen the dynamic range of the amplification circuit. In the present embodiment, the linearity of the output is improved without narrowing the dynamic range of the amplification circuit.

It is assumed, for example, that the level shift circuit 80 shown in FIG. 6 is a source follower circuit including a MOS transistor and a constant-current source circuit. In this case, a minimum potential Vmin of a signal to be input to the source follower circuit is obtained by the following expression.

$$V\text{min} = Vth + 2\sqrt{(2Id/\beta)} \quad (3)$$

where Vth represents a threshold voltage of the MOS transistor, Id represents a drain current of the MOS transistor, and β represents a coefficient obtained by the following expression.

$$\beta = \mu 0 \cdot Cox \cdot (W/L) \quad (4)$$

where μ0 represents the mobility of a carrier, Cox represents a gate capacitance per unit area of the MOS transistor, W represents a gate width of the MOS transistor, and L represents a gate length of the MOS transistor.

The value calculated by Expression (3) is typically about 0.7 V. That is, in the case where the source follower circuit described above is used as the level shift circuit 80, the signal amplitude needs to be Vmin or more for the level shift circuit 80. As a result, the dynamic range is narrowed.

In the present embodiment, switches 110 and 120 and a capacitor 130 function as correction units. An upper electrode of the capacitor 130 is connected to an inversion input terminal of an operation amplifier 10, and a lower electrode thereof is connected to the switches 110 and 120. The switches 110 and 120 are operated exclusively, and set the potential of the lower electrode of the capacitor 130 to VR2 or GND. It is assumed that, in the description below, the capacitance values of the capacitors 40 and 130 are the same as a capacitance value C20 of a capacitor 20 under the same bias condition.

An example will be described where a signal VR1+Vs retained in the capacitor 40 is amplified. First, a switch 50 is turned on with the switch 110 turned on and a switch 60 turned off. As a result, the potentials at both ends of the capacitor 20 become almost equal to the potential VR1. The potential of the upper electrode of the capacitor 130 becomes almost equal to the potential VR1, and the potential of the lower electrode thereof is set to a GND potential.

Next, the switches 50 and 110 are turned off, after which the switch 120 is turned on. As a result, the potential of the lower electrode of the capacitor 130 is set to a potential VR2. In this case, an amount of electric charges transferred from the capacitor 130 to the capacitor 20 is expressed by VR2×C20, and the output of the operation amplifier 10 changes by −VR2. That is, the potential at the inversion input terminal of the operation amplifier 10 becomes VR1, and the potential of the output terminal becomes VR1−VR2. By decreasing the potential of the lower electrode of the capacitor 20, therefore, the bias-dependent characteristic of the capacitance value of the capacitor 20 can be made close to that of the capacitor 40.

Then, when the switch 60 is turned on, the output potential of the amplification circuit changes according to the signal amplitude Vs.

In the present embodiment described above, it is possible to improve the linearity of the output of the amplification circuit while suppressing the narrowing of the dynamic range by the level shift circuit.

Fourth Embodiment

Another embodiment of the present invention will be described.

Figure 8:
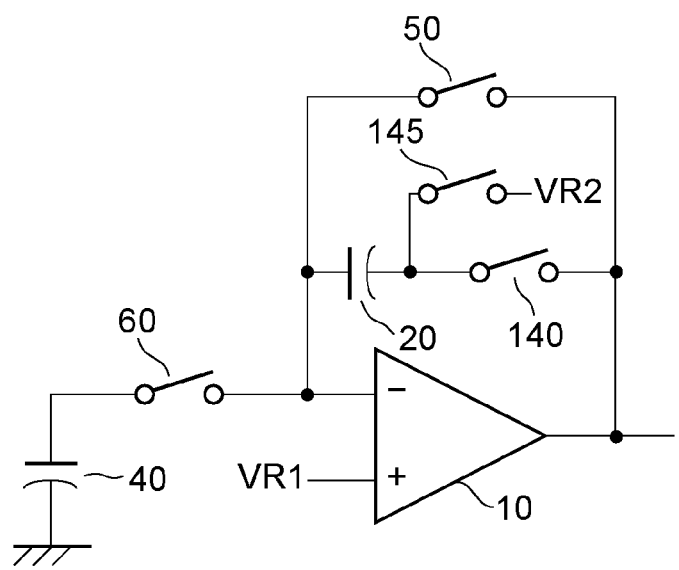
FIG. 8 is an equivalent circuit diagram of an amplification circuit according to a fourth embodiment.

FIG. 8 is an equivalent circuit diagram showing the configuration of an amplification circuit according to the present embodiment. In the description below, the same elements as those shown in FIG. 7 are denoted with the same reference signs, and a difference from the third embodiment will mainly be described.

The amplification circuit according to the present embodiment is not provided with the capacitor 130 or the switches 110 and 120, unlike the amplification circuit according to the third embodiment. Instead, switches 140 and 145 are provided. The switch 140 is provided between a lower electrode of a capacitor 20 and an output terminal of an operation amplifier 10. The switch 145 connects the lower electrode of the capacitor 20 and a power source for supplying a potential VR2.

An operation will be described in which, in the amplification circuit shown in FIG. 8, a signal VR1+Vs retained in the capacitor 40 is amplified. First, the switches 50 and 145 are turned on with the switches 60 and 140 turned off. As a result, the potential of an upper electrode of the capacitor 20 becomes almost equal to the potential VR1, and the potential of the lower electrode thereof is set to VR2.

Next, the switch 140 is turned on after the switches 50 and 145 are turned off. As a result, the potential at the output terminal of the operation amplifier and the potential of the lower electrode of the capacitor 20 become VR2.

After that, the switch 60 is turned on. As a result, the output of the amplification circuit changes according to the signal amplitude Vs.

In the present embodiment, the potential VR1 and the potential VR2 are set such that the relationship of VR1>VR2 is satisfied. In this manner, the bias-dependent characteristic of the capacitor 20 can be made close to that of the capacitor 40. This makes it possible to improve the linearity of the output of the amplification circuit.

In the present embodiment, a switch unit including the switches 140 and 145 and a potential adjusting unit including the capacitor 40 adjust the potential of the lower electrode of the capacitor 20, thereby correcting the bias-dependent characteristics of the capacitance values of the capacitors 20 and 40.

The amplification circuit according to the present embodiment can reduce an influence of random noise as compared to the amplification circuit according to the third embodiment. The reason for this will be described below.

In the amplification circuit according to the third embodiment, the upper electrode of the capacitor 130 is connected to the inversion input terminal of the operation amplifier 10. It is assumed that the sum of the capacitance values associated with the inversion input terminal of the operation amplifier 10 is Cin. Cin in the amplification circuit according to the third embodiment is larger than Cin in the amplification circuit according to the present embodiment by the capacitance value of the capacitor 130.

When a switch is turned off after being turned on, random noise is generally generated due to on resistance of the switch. Random noise is also generated when the switch is turned off. Assuming that the random noise attributed to the switch 50 is Vrn, random noise generated at the output of the operation amplifier 10 after the switch 50 is turned off is obtained by (Cin×Vrn)/C20. Therefore, the amplification circuit according to the present embodiment can reduce the influence of the random noise as compared to the amplification circuit shown in FIG. 7 with a larger value of Cin.

Fifth Embodiment

Another embodiment of the present invention will be described.

Figure 9:
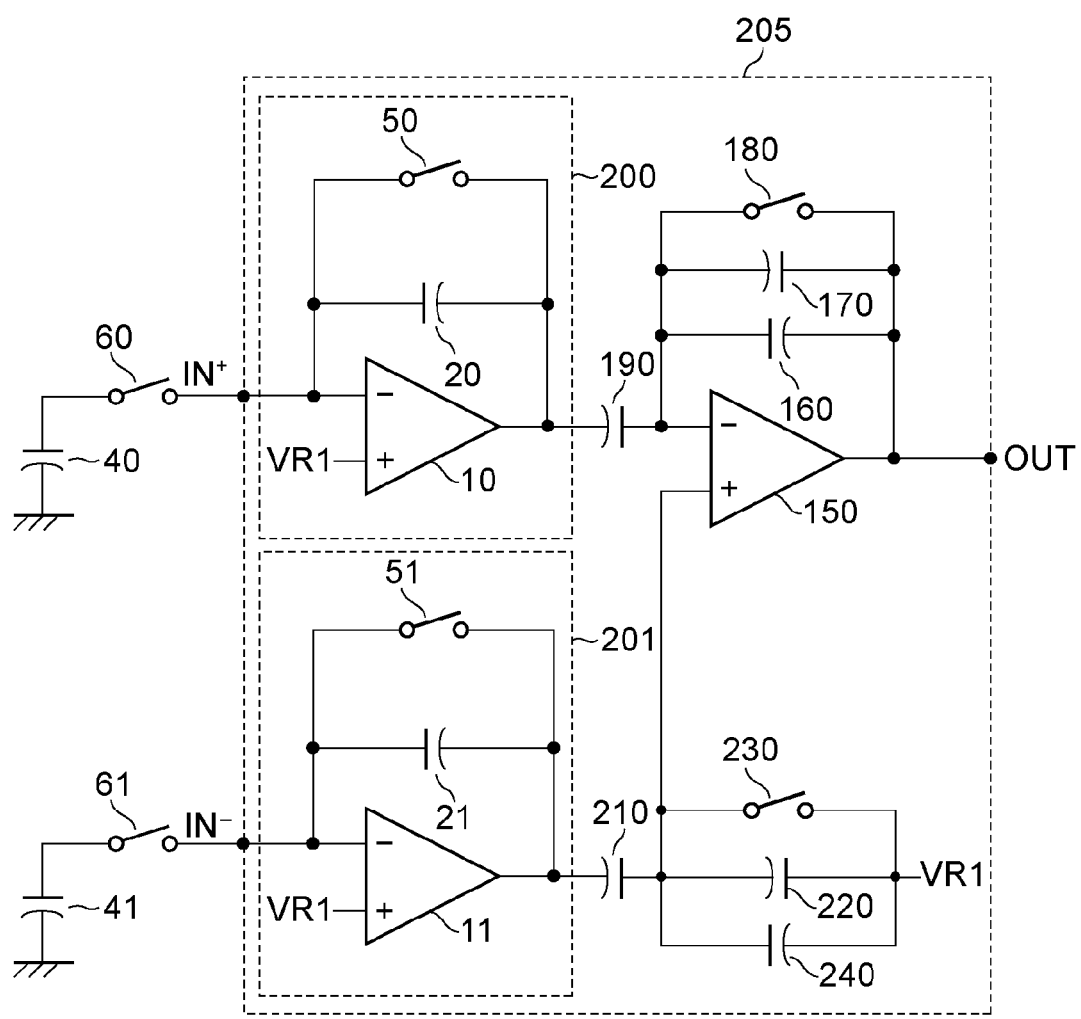
FIG. 9 is an equivalent circuit diagram of an amplification circuit according to a fifth embodiment.

FIG. 9 is an equivalent circuit diagram showing the configuration of an amplification circuit according to the present embodiment. The same elements as those shown in FIG. 3 are denoted with the same reference signs, and a difference from the first embodiment will mainly be described. The present embodiment is different from the first embodiment in that a signal retained in a capacitor 40 is amplified by two operation amplifiers 10 and 150.

An amplification circuit 205 according to the present embodiment includes two amplification units 200 and 201. The first and second amplification units 200 and 201 have the same configuration, and each include an operation amplifier and a capacitor serving as a feedback capacitance. An upper electrode of the feedback capacitance is connected to an inversion input terminal of the operation amplifier, and a lower electrode thereof is connected to an output terminal of the operation amplifier.

The amplification circuit 205 includes input terminals IN+ and IN−, which are respectively connected, via switches, to the upper electrodes of capacitors serving as input capacitances.

The amplification circuit 205 further includes the operation amplifier 150. Input terminals of the operation amplifier 150 are respectively connected to output terminals of the amplification units 200 and 201 via capacitors 190 and 210 serving as first and second connection capacitances. Capacitors 160 and 170, and a switch 180 are provided in a feedback path of the operation amplifier 150. The capacitors 160 and 170 are connected through inverse-parallel connection. More specifically, an upper electrode of the capacitor 160 is connected to a lower electrode of the capacitor 170, while a lower electrode of the capacitor 160 is connected to an upper electrode of the capacitor 170. A non-inversion input terminal of the operation amplifier 150 is connected to a power source for supplying a potential VR1, via fifth and sixth capacitors 220 and 240 and a switch 230. The capacitors 220 and 240 are connected through inverse-parallel connection.

An example will be described where a signal VR1+Vs retained in the capacitor 40 is amplified by the amplification circuit 205. It is assumed that, in the initial state, the potential of an upper electrode of a seventh capacitor 41 is VR1. For example, C20 represents a capacitance value of the capacitor 20, and capacitance values of the other capacitors are represented by similar signs.

First, the switches 50, 51, 230, and 180 are turned on with switches 60 and 61 turned off. As a result, the potentials at both ends of the capacitors 20 and 21 are reset to a potential substantially equal to the potential VR1. At the same time, the potential at the non-inversion input terminal of the operation amplifier 150 is reset to the potential VR1, and the potentials at the inversion input terminal and the output terminal thereof are reset to a potential substantially equal to the potential VR1.

Next, the switches 60 and 61 are turned on after the switches 50, 51, 180, and 230 are turned off. Since the potential of the upper electrode of the capacitor 41 has been set to VR1 in advance, the potential VR1 is maintained even after the switch 61 is turned on. Therefore, the potential at the non-inversion input terminal of the operation amplifier 150 is also maintained at VR1. Meanwhile, due to the switch 60 being turned on, electric charges in an amount of Vs×C40 are transferred to the capacitor 20. As a result, the potential of the output of the operation amplifier 10, i.e., the potential Vout1 at the output terminal of the amplification unit 200 changes to a potential obtained by the following expression.

$$Vout1 = VR1 - (C40/C20)Vs \quad (5)$$

Due to this change in potential, electric charges in an amount of (Vs×C40)/C20 are transferred from the capacitor 190 to the capacitors 160 and 170. Therefore, the potential Vout2 at the output terminal of the operation amplifier 150 changes to a potential obtained by the following expression.

$$Vout2 = VR1 + (C40/C20) \cdot \{C190/(C160+C170)\} \quad (6)$$

Therefore, the gain G, which is a ratio of the potential change ΔVout2 at the output terminal to the potential change ΔVs at the input terminal IN+ of the amplification circuit 205, is obtained by the following expression.

$$G = \Delta Vout2/\Delta Vs = (C40/C20) \cdot \{C190/(C160+C170)\} \quad (7)$$

Assuming that the capacitance values C20, C40, C190, and (C160+C170) are equal under the same bias condition, the gain G of the amplification circuit 205 obtained by Expression (7) is 1. However, the capacitance value of each capacitor has a bias dependency, and thus fluctuates according to the magnitude of the signal amplitude Vs of an input signal. A change in signal amplitude-dependent characteristic of the gain of the operation amplifier 150 in the case where C160 and C170 are changed will be described.

Figure 10A:
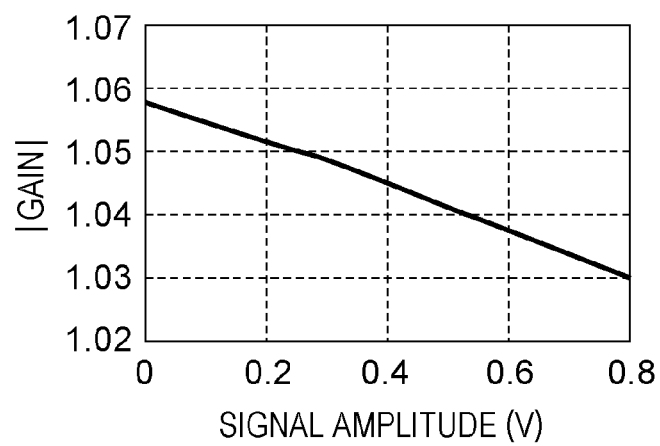
FIGS. 10A and 10B are graphs showing signal amplitude-dependent characteristics of the gain of the amplification circuit according to the fifth embodiment.

FIG. 10A is a graph showing a signal amplitude dependency of the gain of the amplification circuit 205 in the case of C160:C170=10:0, that is, in the case where the capacitor 170 is not provided. It is understood that, under this condition, as the signal amplitude increases, the absolute value of the gain decreases.

When VR1 is 1 V, the potential of the capacitor 40 is in the range of 1 V to 1.8 V in the case where the signal amplitude Vs is in the range of 0 V to 1 V. The potential of the capacitor 20, on the other hand, is in the range of 0 V to 0.8 V. Therefore, an increase in C20 caused by an increase in signal amplitude is larger than an increase in C40, and the value of C40/C20 in Expression (7) is lowered. The potentials of the capacitors 190 and 160 change in the same range, and thus C190 and C160 are at a constant value relative to the signal amplitude Vs. As a result, in the case of C160:C170=10:0, the gain decreases as the signal amplitude increases.

Figure 10B:
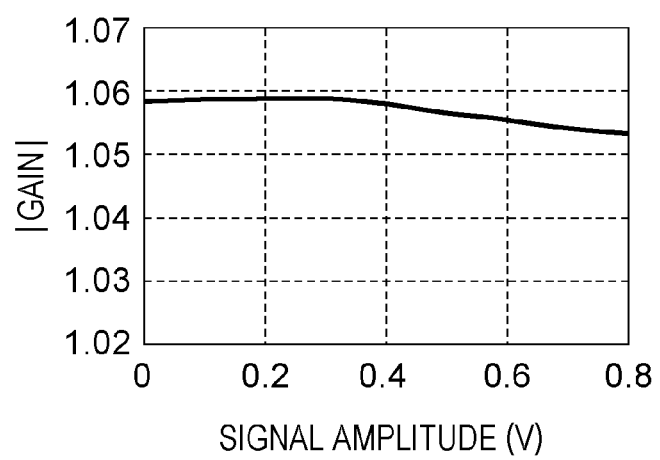

FIG. 10B is a graph showing a signal amplitude-dependent characteristic of the gain of the amplification circuit 205 in the case of C160:C170=7.5:2.5. In this case, the value of C40/C20 in Expression (7) decreases along with an increase in the signal amplitude Vs, while the term of C190/(C160+C170) increases due to the provision of the capacitor 170. Therefore, the gain of the amplification circuit becomes almost constant as compared to the case shown in FIG. 10A. That is, the capacitance C170 improves the linearity of the output of the amplification circuit 205. Although not shown, the characteristic as shown in FIG. 4C can also be obtained by increasing the ratio of C170 to C160, in the case where the linearity in the range where the signal amplitude is large is considered important.

In the amplification circuit 205 according to the present embodiment, the lower electrode of the capacitor 170 is connected to the inversion input terminal of the operation amplifier 150. Therefore, noise generated from the semiconductor substrate is input to the operation amplifier 150. To reduce the influence of the noise, in the present embodiment, the lower electrode of the capacitor 220 is connected to the non-inversion input terminal of the operation amplifier 150. With this configuration, the noise generated from the semiconductor substrate is superimposed also on the non-inversion input terminal of the operation amplifier 150. It is thus possible to reduce the noise according to in-phase noise reduction performance of the operation amplifier 150.

In addition, the amplification unit 201 and the capacitor 210 are provided in the present embodiment. With this configuration, the operation amplifier 150 can reduce in-phase noise to be superimposed on signals at the capacitors 40 and 41.

Note that the switch 61 may not be provided in the amplification circuit 205. However, it is preferable to provide the switch 61 in order to obtain a symmetrical configuration with respect to the input terminal IN+. Although the switch 61 may be constantly turned on, the same operation as the input terminal IN+ is preferably performed.

Sixth Embodiment

Figure 11:
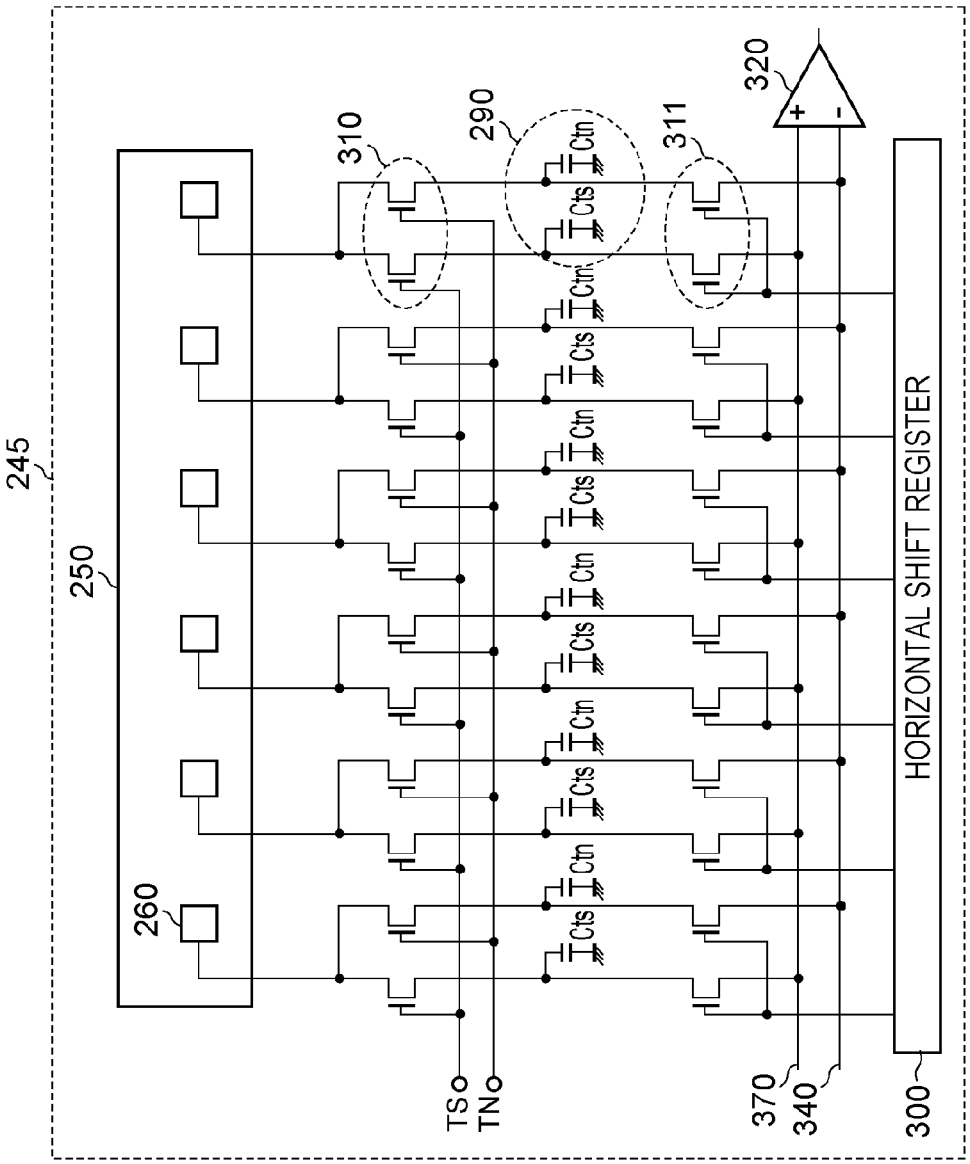
FIG. 11 is a diagram showing the configuration of a photoelectric conversion apparatus according to a sixth embodiment.

Another embodiment of the present invention will be described. FIG. 11 is a diagram showing an example where the amplification circuit described above is used in a photoelectric conversion apparatus having pixels of 1 row×6 columns.

The photoelectric conversion apparatus 245 includes a pixel array 250 provided with a plurality of pixels 260, memories 290, switches 310 and 311, a horizontal shift register 300, horizontal signal lines 340 and 370, and an amplification circuit 320.

Signals output from the pixel are retained in the memory 290 via the switch 310. When the switch 311 is turned on by the horizontal shift register 300, the signals retained in the memory 290 are transmitted to the amplification circuit 320 via the horizontal signal lines 340 and 370.

The memory 290 includes two holding capacitances Ctn and Cts, which hold noise components and signal components output from the pixel 260, respectively. Therefore, it is possible to reduce the noise components from the signal components by the amplification circuit 320 calculating a difference between the capacitances. Examples of the noise component mentioned herein include noise generated upon resetting an input of an amplifier that may be provided in each of the pixels 260.

For example, the amplification circuit 205 described in the fifth embodiment can be used as the amplification circuit 320. In this case, the capacitor 40 corresponds to the holding capacitance Cts, the capacitor corresponds to the holding capacitance Ctn, and the switch 311 corresponds to the switches 60 and 61.

Figure 12:
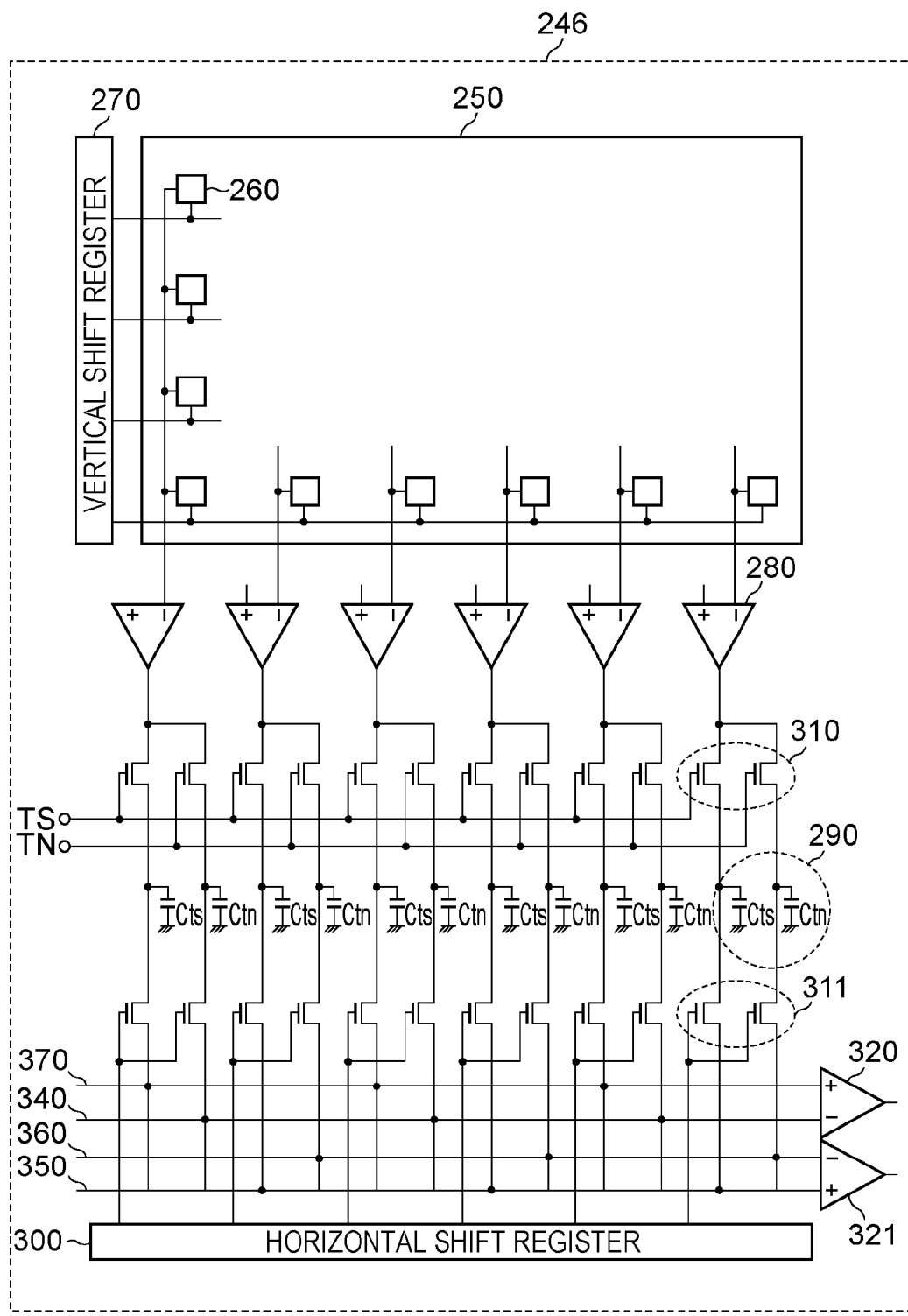
FIG. 12 is a diagram showing the configuration of the photoelectric conversion apparatus according to the sixth embodiment.

The pixel array 250 may include a plurality of rows of pixels 260. FIG. 12 is a diagram showing an exemplary configuration of a photoelectric conversion apparatus including pixels of 4 rows×6 columns.

The photoelectric conversion apparatus 246 is different from the photoelectric conversion apparatus 245 in that a vertical shift register 270 is provided for selecting a row of pixels, and an amplification circuit 280 is provided for each column of the pixel array 250. The photoelectric conversion apparatus 246 is different from the photoelectric conversion apparatus 245 also in that amplification circuits 320 and 321 are provided, which are respectively connected to different memories 290 on every other column.

In the present embodiment, the signals retained in the memory 290 include noise components attributed to the amplification circuit 280. It is possible to reduce the noise, attributed to the amplification circuit 280, by the amplification circuits 320 and 321 calculating a difference between the signals retained in the memories 290.

In the case where the pixel array 250 of the present embodiment is provided with a color filter of Bayer array, the amplification circuits 320 and 321 amplify different color components of signals. The color filter generally has a different light transmittance for each other. Therefore, the signals respectively supplied to the amplification circuits 320 and 321 have different signal amplitudes. In the case where the amplification circuit 205 described in the fifth embodiment is used as the amplification circuits 320 and 321, it is possible to optimize the linearity of the output of each amplification circuit by setting the ratio between the capacitance values of the capacitors 160 and 170 according to the range of signal amplitude of input signals. For example, the amplification circuit with a small signal amplitude of input signals is set to have the characteristic as shown in FIG. 10B such that C160:C170=7.5:2.5 is satisfied, while the amplification circuit with a large signal amplitude of input signals is set to have the characteristic as shown in FIG. 4C such that C160:C170=6.5:3.5 is satisfied.

The amplification circuits described in the above embodiments can be used also for the amplification circuit 280.

Seventh Embodiment

Figure 13:
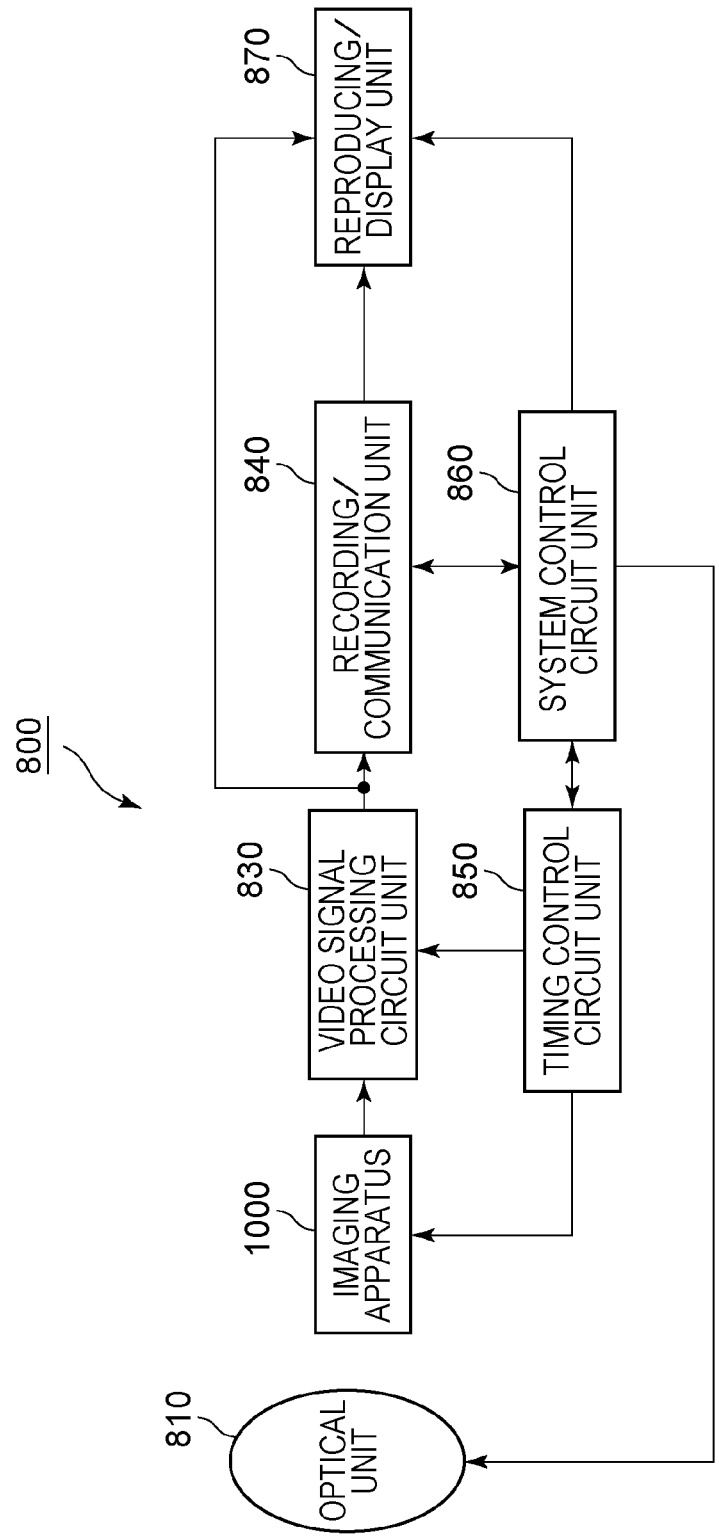
FIG. 13 is a diagram showing the configuration of an imaging system according to a seventh embodiment.

Next, an imaging system according to the present embodiment will be schematically described with reference to FIG. 13.

The imaging system 800 includes, for example, an optical unit 810, an imaging apparatus 1000, a video signal processing circuit unit 830, a recording/communication unit 840, a timing control circuit unit 850, a system control circuit unit 860, and a reproducing/display unit 870. The photoelectric conversion apparatus described in the sixth embodiment is used as the imaging apparatus 1000.

The optical unit 810 serving as an optical system such as a lens focuses light from a subject on a pixel array of the imaging apparatus 1000 to form a subject image. The pixel array includes a plurality of two-dimensionally arranged pixels. The imaging apparatus 1000 outputs a signal corresponding to the light focused on the pixel array, at a timing based on a signal from the timing control circuit unit 850.

The signal output from the imaging apparatus 1000 is input to the video signal processing circuit unit 830 serving as a video signal processing unit. The video signal processing circuit unit 830 then processes the input electric signal through, for example, AD conversion according to a method determined by a program or the like. The signal subjected to the processing by the video signal processing circuit unit 830 is transmitted to the recording/communication unit 840 as image data. The recording/communication unit 840 transmits a signal for image formation to the reproducing/display unit 870, which reproduces/displays a moving image or a still image. The recording/communication unit 840 also communicates with the system control circuit unit 860 in response to a signal received from the video signal processing circuit unit 830, and records the signal for image formation in a recording medium (not shown).

The system control circuit unit 860 collectively controls the operation of the imaging system 800. The system control circuit unit 860 controls driving of the optical unit 810, the timing control circuit unit 850, the recording/communication unit 840, and the reproducing/display unit 870. The system control circuit unit 860 also includes a storage device (not shown) as a recording medium, for example. A program and the like required for controlling the operation of the imaging system 800 are stored in the storage device. In the imaging system 800, the system control circuit unit 860 supplies a signal for switching a driving mode according to, for example, the operation of a user. Specific examples of the operation include changing of a row to be read or reset, changing of a field angle due to electronic zooming, and shifting of a field angle due to electronic image stabilization.

The timing control circuit unit 850 controls the drive timing of the imaging apparatus 1000 and the video signal processing circuit unit 830 based on the control by the system control circuit unit 860 (control unit).

The video signal processing circuit unit 830 retains the correction coefficient described in the above embodiments, and executes correction processing on a signal output from the imaging apparatus 1000.

The embodiments described above are exemplary embodiments for describing the present invention, and can be modified or combined in various ways without departing from the technical idea of the present invention.

(Others)

The amplification circuits according to the above embodiments have been described by way of the exemplary configuration including the operation amplifier 10. Alternatively, however, a common-source circuit may be used instead of the operation amplifier.

The capacitor described above is formed using a polysilicon layer and a semiconductor layer. Alternatively, however, the capacitor may be formed using two polysilicon or metal layers with an insulating layer interposed therebetween, or using a MOSFET.

In the embodiments described above, the amplification circuit includes an inversion amplification circuit. Alternatively, however, the amplification circuit may include a non-inversion amplification circuit.

The above embodiments have been described merely as exemplary embodiments for implementing the present invention, and can be modified in their configuration in various ways or combined without departing from the spirit of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-076771, filed Mar. 29, 2012, which is hereby incorporated by reference herein in its entirety.

What is claimed is:

1. An amplification circuit, comprising:
   an amplifier;
   a first capacitor including a first terminal connected to an input terminal of the amplifier;
   a second capacitor including a first terminal connected to the input terminal of the amplifier and a second terminal connected to an output terminal of the amplifier; and
   a correction unit configured to correct a difference in bias-dependent characteristic between capacitance values of the first and second capacitors.

2. The amplification circuit according to claim 1, wherein the correction unit is at least one of a third capacitor provided in parallel to the first capacitor and a fourth capacitor provided in parallel to the second capacitor.

3. The amplification circuit according to claim 1, wherein the correction unit includes a potential adjusting unit configured to adjust a potential at the second terminal of the second capacitor.

4. The amplification circuit according to claim 3, wherein the potential adjusting unit includes a first terminal connected to the input terminal of the amplifier and a second terminal connected to a power source.

5. The amplification circuit according to claim 3, wherein the potential adjusting unit includes a level shift circuit, and
   the second terminal of the second capacitor is connected to the output terminal of the amplifier via the level shift circuit.

6. The amplification circuit according to claim 3, wherein the potential adjusting unit includes a switch unit, and
   the second terminal of the second capacitor is connected to a power source or the output terminal of the amplifier via the switch unit.

7. The amplification circuit according to claim 3, further comprising:
   a first amplification unit;
   a second amplification unit;
   a first connection capacitor; and
   a second connection capacitor,
   wherein the amplifier is an operation amplifier,
   the first capacitor is connected to an inversion input terminal of the operation amplifier via the first amplification unit and the first connection capacitor, and
   an output terminal of the second amplification unit is connected to a non-inversion input terminal of the operation amplifier via the second connection capacitor.

8. The amplification circuit according to claim 7, further comprising:
   a fifth capacitor; and
   a sixth capacitor provided in parallel to the fifth capacitor,
   wherein the non-inversion input terminal of the operation amplifier is further connected to a power source via the fifth and sixth capacitors.

9. The amplification circuit according to claim 7, further comprising:
   a seventh capacitor,
   wherein the seventh capacitor is connected to an input terminal of the second amplification unit.

10. The amplification circuit according to claim 1, wherein the first and second capacitors each include an upper electrode mainly containing polysilicon and a semiconductor lower electrode, and
    the upper electrodes of the first and second capacitors are the first terminals thereof.

11. A photoelectric conversion apparatus, comprising:
    the amplification circuit according to claim 1; and
    a plurality of pixels,
    wherein the amplification circuit is configured to amplify a signal based on the pixel.

12. An imaging system, comprising:
    the photoelectric conversion apparatus according to claim 11; and
    a signal processing unit configured to process a signal output from the photoelectric conversion apparatus.

* * * * *